(12) United States Patent
Yoshinobu

(10) Patent No.: US 7,535,040 B2
(45) Date of Patent: May 19, 2009

(54) INSULATED GATE SEMICONDUCTOR DEVICE AND METHOD FOR MANUFACTURING SAME

(75) Inventor: Kono Yoshinobu, Niiza (JP)

(73) Assignee: Sanken Electric Co. Ltd., Saitama (JP)

( * ) Notice: Subject to any disclaimer, the term of this patent is extended or adjusted under 35 U.S.C. 154(b) by 171 days.

(21) Appl. No.: 10/591,009

(22) PCT Filed: Apr. 5, 2005

(86) PCT No.: PCT/JP2005/006674

§ 371 (c)(1),
(2), (4) Date: Aug. 28, 2006

(87) PCT Pub. No.: WO2005/122274

PCT Pub. Date: Dec. 22, 2005

(65) Prior Publication Data

US 2008/0093623 A1    Apr. 24, 2008

(30) Foreign Application Priority Data

Jun. 14, 2004 (JP) ............................... 2004-176019

(51) Int. Cl.
*H01L 29/80* (2006.01)

(52) U.S. Cl. ........................................ 257/273; 257/378

(58) Field of Classification Search ................. 257/133, 257/139, 273, 378
See application file for complete search history.

(56) References Cited

U.S. PATENT DOCUMENTS

| | | | | |
|---|---|---|---|---|
| 5,264,378 A | * | 11/1993 | Sakurai | ...................... 438/138 |
| 5,372,954 A | * | 12/1994 | Terashima | ................... 438/138 |
| 2002/0153586 A1 | * | 10/2002 | Majumdar et al. | .......... 257/506 |

* cited by examiner

*Primary Examiner*—Phat X Cao
(74) *Attorney, Agent, or Firm*—Townsend and Townsend and Crew LLP

(57) ABSTRACT

In an insulated gate semiconductor device (1) having an N⁻ type base region (11), P⁺ type collector regions (12), P type base regions (13), and N⁺ type emitter regions (14), an N⁺ type collector-short region (15) which extends toward the N⁻ type base region (11) farther than the P⁺ type collector regions (12) is formed in the lower surface of the N⁻ type base region (11), and a P⁺ type semiconductor region (16) is formed between the N⁺ type collector-short region (15) and the N⁻ type base region (11).

10 Claims, 4 Drawing Sheets

INSULATED GATE SEMICONDUCTOR DEVICE AND METHOD FOR MANUFACTURING SAME

TECHNICAL FIELD

The present invention relates to an insulated gate semiconductor device and a method for manufacturing the same.

BACKGROUND ART

An insulated gate bipolar transistor (IGBT) has a high input impedance of a field effect transistor and a high current drive capability of a bipolar transistor, and is particularly suitably used as a power switching device.

Conventionally, an IGBT comprises an $N^-$ type base region, a P type base region formed in a predetermined surface region of the $N^-$ type base region, an $N^+$ type emitter region formed in a predetermined surface region of the P type base region, a $P^+$ type collector region formed at the lower surface of the $N^-$ type base region via an $N^+$ type buffer region, a collector electrode electrically connected to the $P^+$ type collector region, a gate insulating film formed on a predetermined surface region of the $N^-$ type base region, a gate electrode formed on the gate insulating film, and an emitter electrode electrically connected to the $N^+$ type emitter region.

In an IGBT structured in this manner, since the $P^+$ type collector region is formed at the lower surface of the $N^-$ type base region via the $N^+$ type buffer region, carriers are stored in the $N^+$ type buffer region or in the $N^-$ type base region near the $N^+$ type buffer region when the device is turned off. Since there is no path for the stored carriers to be discharged, a tail current continues flowing until they disappear by their recombination, resulting in a problem that the speed to turn off becomes slow.

Though there is a method of introducing a lifetime killer for promoting the carrier recombination to increase the speed to turn off, this in turn causes a problem that the forward-direction voltage is increased.

Hence, an IGBT has been developed, in which an $N^+$ type collector-short region is formed in the $P^+$ type collector region so that the carriers in the $N^+$ type buffer region or in the $N^-$ type base region near this region are discharged immediately (for example, patent Literature 1).

Since the IGBT disclosed in the patent Literature 1 can discharge the carriers stored in the $N^+$ type buffer region or in the $N^-$ type base region near this region through the $N^+$ type collector-short region when it is to be turned off, it can increase the turn-off speed. Further, since it does not use a lifetime killer, its forward-direction voltage characteristic is not damaged.

Patent Literature 1: Unexamined Japanese Patent Application KOKAI Publication No. H5-3205

DISCLOSURE OF INVENTION

Problem to be Solved by the Invention

However, the technique disclosed in the patent Literature 1 has a problem that as the width of the $N^+$ type collector-short region becomes wider, the degree of conductance modulation is weakened to make MOS behaviors appear remarkably to make it harder for the device to behave as an IGBT. This is considered to be due to the following reason.

The $N^+$ type collector-short region is formed by diffusing an N type impurity from the lower surface of the $N^-$ type base region. Since the P type base region and the $N^+$ type emitter region are formed in the upper surface of the $N^-$ type base region by diffusion normally after the $N^+$ type collector-short region is formed, the width of the $N^+$ type collector-short region broadens in some cases due to heat treatment at the time of forming the P type base region and the $N^+$ type emitter region by diffusion. If the width of the $N^+$ type collector-short region broadens as this, the area of the $P^+$ type collector region decreases. This reduces the total amount of holes to be injected into the $N^-$ type base region from the $P^+$ type collector region, and consequently weakens the degree of conductance modulation of the device and makes MOS behaviors appear remarkably.

The present invention was made in view of the above-described circumstance, and an object of the present invention is to provide an insulated gate semiconductor device which is turned off rapidly and behaves favorably.

Another object of the present invention is to provide a method for manufacturing an insulated gate semiconductor device which is turned off rapidly and behaves favorably.

Means for Solving the Problem

To achieve the above objects, an insulated gate semiconductor device according to a first aspect of the present invention comprises:

a first semiconductor region having a first conductivity type;

second semiconductor regions having a second conductivity type, formed in one principal surface of the first semiconductor region;

third semiconductor regions having the second conductivity type, formed in surface regions of the other principal surface of the first semiconductor region;

fourth semiconductor regions having the first conductivity type, formed in surface regions of the third semiconductor regions;

a first electrode electrically connected to the fourth semiconductor regions;

a control electrode disposed, via an insulating film, on the other principal surface between the first semiconductor region and the fourth semiconductor regions; and a second electrode electrically connected to the second semiconductor regions, wherein the insulated gate semiconductor device comprises:

a fifth semiconductor region having the first conductivity type, formed in the one principal surface of the first semiconductor region so as to be adjacent to the second semiconductor regions; and a sixth semiconductor region having the second conductivity type, formed between the fifth semiconductor region and the first semiconductor region.

The sixth semiconductor region may be formed between a side of the fifth semiconductor region closer to the other principal surface and the first semiconductor region.

The fifth semiconductor region may be formed so as to be more prominent than the second semiconductor regions.

The width of the sixth semiconductor region may be smaller than a width of the fifth semiconductor region.

The sixth semiconductor region may be formed such that at least a part of the fifth semiconductor region contacts the first semiconductor region.

Concentration of an impurity of the second conductivity type in the sixth semiconductor region may be $1\times10^{15}$ to $5\times10^{18}$ cm$^{-3}$.

The fifth semiconductor region may be formed so as not to face the third semiconductor regions.

The first semiconductor region may comprise a first region and second regions higher in impurity concentration than the first region, and the second regions may be adjacent to the fifth semiconductor region.

To achieve the above objects, a method for manufacturing an insulated gate semiconductor device is a method for manufacturing an insulated gate semiconductor device according to a second aspect of the present invention comprising: a first semiconductor region having a first conductivity type; second semiconductor regions having a second conductivity type, formed in one principal surface of the first semiconductor region; third semiconductor regions having the second conductivity type, formed in surface regions of the other principal surface of the first semiconductor region; fourth semiconductor region having the first conductivity type, formed in surface regions of the third semiconductor regions; a first electrode electrically connected to the fourth semiconductor regions; a control electrode disposed, via an insulating film, on the other principal surface between the first semiconductor region and the fourth semiconductor regions and a second electrode electrically connected to the second semiconductor regions, the method comprising:

a step of forming a fifth semiconductor region having the first conductivity type in the one principal surface of the first semiconductor region so as to be adjacent to the second semiconductor regions; and a step of forming a sixth semiconductor region having the second conductivity type, between the fifth semiconductor region and the first semiconductor region.

Effects of the Invention

The present invention can provide an insulated gate semiconductor device which is turned off rapidly and behaves favorably.

Further, the present invention can provide a method for manufacturing an insulated gate semiconductor device which is turned off rapidly and behaves favorably.

EXPLANATION OF REFERENCE NUMERALS

Figure 1:
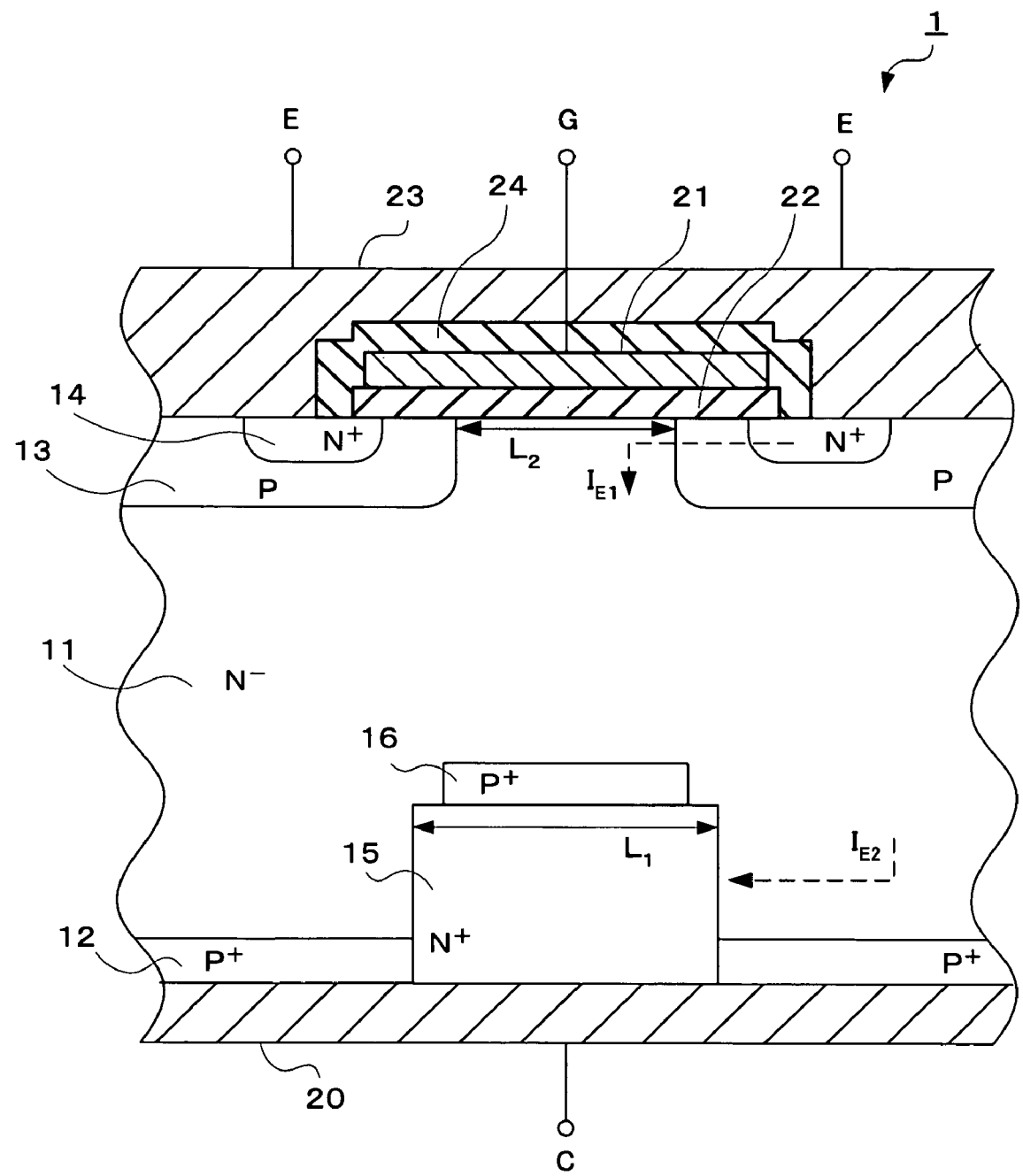
[FIG. 1] It is a diagram showing a cross-sectional structure of an insulated gate semiconductor device according to an embodiment of the present invention.

1 IGBT
11 N⁻ type base region
12 P⁺ type collector regions
13 P type base regions
14 N⁺ type emitter regions
15 N⁺ type collector-short region
16 P⁺ type semiconductor region
20 collector electrode
21 gate electrode
22 gate insulating film
23 emitter electrode
24 insulating film

BEST MODE FOR CARRYING OUT THE INVENTION

An insulated gate semiconductor device according to an embodiment of the present invention will be explained with reference to the drawings. The present embodiment will be explained by employing an example in which the insulated gate semiconductor device is an insulated gate bipolar transistor (IGBT).

The cross-sectional structure of an IGBT 1 according to the embodiment of the present invention is shown in FIG. 1.

As shown in FIG. 1, the IGBT 1 comprises an N⁻ type base region 11 as a first semiconductor region, P⁺ type collector regions 12 as second semiconductor regions, P type base regions 13 as third semiconductor regions, N⁺ type emitter regions 14 as fourth semiconductor regions, an N⁺ type collector-short region 15 as a fifth semiconductor region, a P⁺ type semiconductor region 16 as a sixth semiconductor region, a collector electrode 20 as a first electrode, a gate electrode 21 as a control electrode, a gate insulating film 22, an emitter electrode 23 as a second electrode, and an insulating film 24.

The N⁻ type base region 11 is formed of an n type semiconductor region in which an impurity of a first conductivity type, for example, N type such as phosphorus, etc. is diffused. The N⁻ type base region 11 is formed to have a thickness of, for example, about 40 to 120 μm and an impurity concentration of about $5 \times 10^{12}$ to $5 \times 10^{15}$ cm$^{-3}$.

The P⁺ type collector regions 12 are formed of a P type semiconductor region in which an impurity of a second conductor type, for example, P type such as boron, etc. is diffused. The P⁺ type collector regions 12 are formed at predetermined regions on one principal surface (lower surface) of the N⁻ type base region 11. The P⁺ type collector regions 12 are electrically connected to the collector electrode 20 formed on their lower surface, and inject holes into the N⁻ type base region 11 when the IGBT 1 operates, thereby producing conductance modulation.

The P⁺ type collector regions 12 are formed to have a thickness of, for example, about 2 to 10 μm. The P type impurity concentration of the P⁺ type collector regions 12 is formed to be, for example, an impurity concentration of about $1 \times 10^{15}$ to $5 \times 10^{18}$ cm$^{-3}$.

The P type base regions 13 are formed of a P type semiconductor region in which an impurity of a P type is diffused. The P type base regions 13 are formed in predetermined surface regions in the other principal surface (upper surface) of the N⁻ type semiconductor region 11. The P type base regions 13 are formed such that the interval therebetween, i.e., the width $L_2$ of the N⁻ type base region 11 between the P type base regions 13 is, for example, about 5 to 30 μm.

According to the present embodiment, the P type base regions 13 are formed at positions facing the P⁺ type collector regions 12. Therefore, the N⁺ type collector-short region 15 formed between the P⁺ type collector regions 12 and the N⁻ type base region 11 between the P type base regions 13 face each other, as will be described later.

The P type base regions 13 are formed to have a thickness of, for example, about 2.5 to 4.5 μm. The P type impurity concentration of the P type base regions 13 is formed to be lower than the impurity concentration of the P⁺ type collector regions 12, to be an impurity concentration of, for example, $1 \times 10^{16}$ to $3 \times 10^{18}$ cm$^{-3}$.

The N+ type emitter regions 14 are formed of an N type semiconductor region in which an impurity of N type is diffused. The N+ type emitter regions 14 are formed in predetermined surface regions in the P type base regions 13. The N+ type emitter region 14 are electrically connected to the emitter electrode 23 formed on their upper surface.

The N+ type emitter region 14 is formed to have a thickness of, for example, about 0.4 to 0.8 μm. The N type impurity concentration of the N+ type emitter regions 14 is formed to be higher than the N− type base region 11, to be an impurity concentration of, for example, $5 \times 10^{18}$ to $1 \times 10^{20}$ cm$^{-3}$.

The N+ type collector-short region 15 is formed of an N type semiconductor region in which an N type impurity is diffused. The N+ type collector-short region 15 is formed between the P+ type collector regions 12 on the lower surface of the N− type base region 11. Here, since the P type base regions 13 and the P+ type collector regions 12 are formed to face each other, the N+ type collector-short region 15 formed between the P+ type collector regions 12 faces the N− type base region 11 between the P type base regions 13.

The N+ type collector-short region 15 is formed such that its upper surface is more prominent than the P+ type collector regions 12. The width $L_1$ of the N+ type collector-short region 15 is formed to be larger than the width $L_2$ of the N− type base region 11, to be, for example, about 10 to 100 μm.

The N+ type collector-short region 15 is formed to have a thickness of, for example, about 5 to 30 μm. The N type impurity concentration of the N+ type collector-short region 15 is formed to be higher than the N− type base region 11, to be an impurity concentration of, for example, about $1 \times 10^{17}$ to $1 \times 10^{20}$ cm$^{-3}$.

Further, the N+ type collector-short region 15 is electrically connected to the collector electrode 20 formed on its lower surface, and discharges carriers stored in the N− type base region 11 to the collector electrode 20 when the device is to be turned off, thereby functioning to increase the turn-off speed of the device.

The P+ type semiconductor region 16 is formed of a P type semiconductor region in which an impurity of P type is diffused. The P+ type semiconductor region 16 is formed on the upper surface of the N+ type collector-short region 15 to have a thickness of, for example, about 7 to 40 μm. The P+ type semiconductor region 16 is not exposed at the lower surface of the semiconductor substrate, and is not directly electrically connected to the collector electrode 20. Thus, the P+ type semiconductor region 16 is in a floating state electrically. The P+ type semiconductor region 16 functions as a current block region to block a current that is to flow into the N− type base region 11.

The impurity concentration of the P+ type semiconductor region 16 is set to a concentration at which a depletion layer that will extend from the PN junctions formed at the interfaces between the P type base regions 13 and the N− type base region 11 when a reverse-direction voltage is applied between the collector electrode 20 and the emitter electrode 23 will spread over almost the entire dimension of the P+ type semiconductor region 16 in the direction of thickness, and is preferably about $5 \times 10^{15}$ to $1 \times 10^{18}$ cm$^{-3}$. Hence, the IGBT 1 according to the present embodiment can obtain a relatively large reverse-direction voltage withstand.

The collector electrode 20 is formed of aluminum or the like. The collector electrode 20 is formed on the entire lower surface of the P+ type collector regions 12 and N+ type collector-short region 15, and is electrically connected to the P+ type collector regions 12 and the N+ type collector-short region 15.

The gate electrode 21 is formed of polysilicon or the like. The gate electrode 21 is disposed, via the gate insulating film 22 formed of a silicon-base film or the like, above the P type base regions 13 (channel forming regions) between the N− type base region 11 and the N+ type emitter regions 14. When a voltage is applied to the gate electrode 21, channels are formed in the P type base regions 13.

The emitter electrode 23 is formed of aluminum or the like. The emitter electrode 23 is formed on the upper surface of the N+ type emitter regions 14, etc.

The insulating film 24 formed of a silicon-base film or the like is formed between the emitter electrode 23 and the gate electrode 21.

When a predetermined voltage is applied to the gate electrode 21 and channels are formed in the P type base regions 13 in the IGBT 1 structured as described above, an electron current $I_{E1}$ flows toward the N+ type collector-short region 15 as shown in FIG. 1.

Here, the N+ type collector-short region 15 is formed to be more prominent than the P+ type collector regions 12 and the P+ type semiconductor region 16 is formed on the upper surface of the N+ type collector-short region 15. Therefore, much of the electron current $I_{E1}$ that flows toward the upper surface of the N+ type collector-short region 15 is blocked by the P+ type semiconductor region 16 to flow along the PN junctions formed by the P+ type collector regions 12 and the N− type base region 11. That is, such an electron current $I_{E2}$ as shown in FIG. 1 flows.

Like this, the amount of the electron current $I_{E1}$ that flows into the N+ type collector-short region from the upper surface thereof is reduced, and as a result, the electron current $I_{E2}$ that flows along the PN junctions formed by the P+ type collector regions 12 and the N− type base region 11 relatively increases. With the electron current $I_{E2}$ increasing like this, the PN junctions formed by the P+ type collector region 12 and the N− type base region 11 are biased deeply in the forward direction to inject holes into the N− type base region 11, thereby finely producing conductance modulation.

Thus, according to the IGBT 1 of the present embodiment, even though the width $L_1$ of the N+ type collector-short region 15 is formed larger than the width $L_2$ of the N− type base region 11 between the P type base regions 13 and the area of the P+ type collector regions 12 is thus reduced, conductance modulation is finely produced and favorable IGBT behaviors can be obtained.

Further, according to the IGBT 1 of the present embodiment, since the impurity concentration of the P+ type semiconductor region 16 is set to a concentration at which a depletion layer that will extend from the PN junctions formed at the interfaces between the P type base regions 13 and the N− type base region 11 when a reverse-direction voltage is applied between the collector electrode 20 and the emitter electrode 23 will spread over almost the entire dimension of the P+ type semiconductor region 16 in the direction of thickness, a relatively large reverse-direction voltage withstand can be obtained.

Further, according to the IGBT 1 of the present embodiment, since the P+ type semiconductor region 16 for blocking an electron current is in a floating state electrically, a parasitic element such as a parasitic transistor, a parasitic thyristor, etc., which includes the P+ type semiconductor region 16 as part of its semiconductor region, will not be formed.

As described above, in the IGBT 1 of the present embodiment, by the electron current $I_{E1}$ being blocked by the P+ type semiconductor region 16, the electron current $I_{E2}$ is increased as compared to the conventional techniques, and the PN junctions formed by the P+ type collector regions 12 and the N− type base region 11 are deeply biased in the forward direction. Accordingly, the amount of holes to be supplied from the P+ type collector regions 12 to the N− type base region 11 increases, and conductance modulation is finely obtained, making it possible to obtain favorable IGBT behaviors.

Next, a method for manufacturing the semiconductor device of the present invention will be explained with reference to the drawings by employing the case of the IGBT 1 as configured above as an example. FIGS. 2A to 2D show the manufacturing process of the IGBT 1 according to the present embodiment. Note that the process shown in the drawings is an example, and the manufacturing process is not limited to this process as long as the same resultant product can be obtained.

First, an N type semiconductor substrate 30, in which an N type impurity such as arsenic, etc. is implanted, is prepared.

Figure 2A:
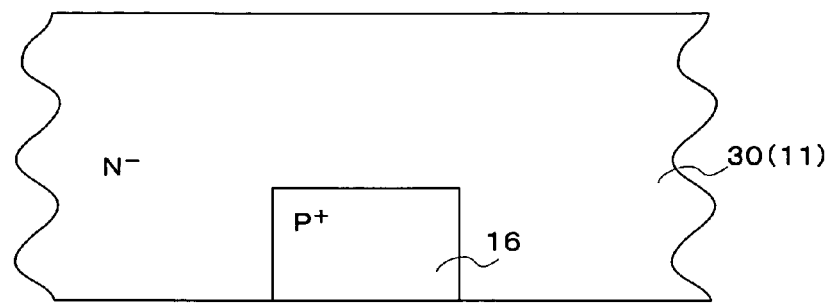
[FIG. 2] These are diagrams showing a manufacturing process of the insulated gate semiconductor device according to the embodiment of the present invention.

Next, the P+ type semiconductor region 16 is formed in the lower surface region of the N type semiconductor substrate 30 by ion implantation, thermal diffusion, or the like, as shown in FIG. 2A.

Figure 2B:
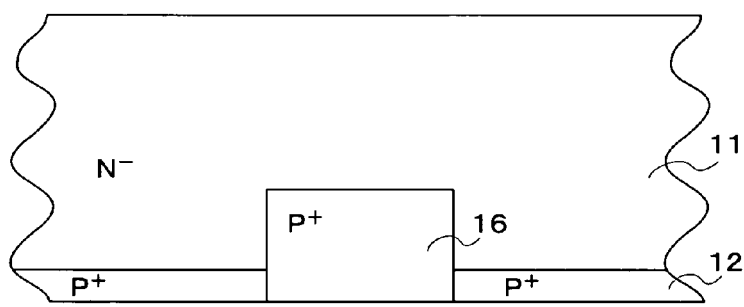

Then, the P+ type collector regions 12 are formed in the entire lower surface regions on both sides of the P+ type semiconductor region 16 by ion implantation or the like, as shown in FIG. 2B.

Figure 2C:
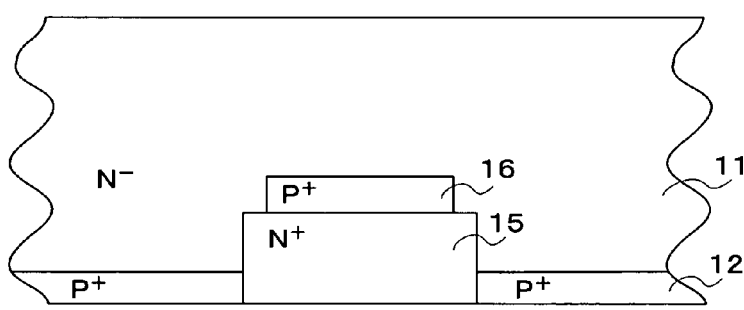

Next, an N type impurity is diffused by ion implantation or the like at the position of the P+ type semiconductor region 16 formed in FIG. 2A such that the N type impurity is shallower than the depth of the P+ type semiconductor region 16 and wider than the P+ type semiconductor region 16, to form the N+ type collector-short region 15, as shown in FIG. 2C.

Figure 2D:
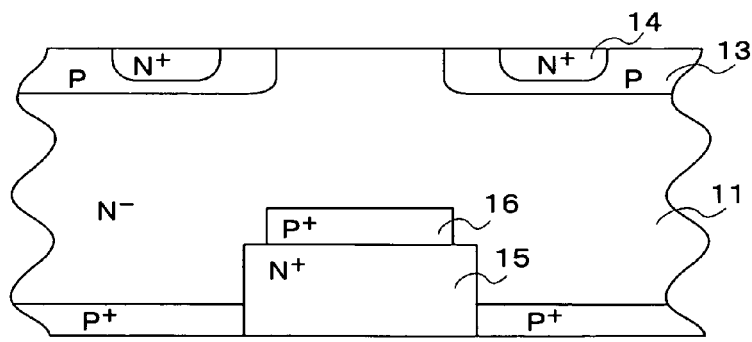

Next, a P type impurity and an N type impurity are continuously and selectively diffused in the surface region of the N− type base region 11 to sequentially form the P type base regions 13 and the N+ type emitter regions 14 as shown in FIG. 2D.

After then, the collector electrode 20, the gate insulating film 22, the gate electrode 21, the insulating film 24, and the emitter electrode 23 are formed, thereby the IGBT 1 as shown in FIG. 1 is obtained.

The present invention is not limited to the above-described embodiment, but can be modified and applied in various manners. For example, in the above-described embodiment, the width of the P+ type semiconductor region 16 is formed slightly narrower than the width $L_1$ of the N+ type collector-short region 15. However, the P+ type semiconductor region 16 may be formed on the entire upper surface of the N+ type collector-short region 15.

Further, the P+ type semiconductor region 16 may be formed not only on the entire upper surface of the N+ type collector-short region 15, but on the side surfaces thereof. In this case, the P+ type semiconductor region 16 needs to be formed so as to contact at least a part of the side surfaces of the N+ type collector-short region 15.

The above-described embodiment was explained by employing a case where the width $L_1$ of the N+ type collector-short region 15 is larger than the width $L_2$ of the N− type base region 11 as an example. However, the present invention is not limited to this, but the width $L_1$ of the N+ type collector-short region 15 may be smaller than the width $L_2$ of the N− type base region 11.

Though having said this, the present invention is particularly effective in the case where the width $L_1$ of the N+ type collector-short region 15 is larger than the width $L_2$ of the N− type base region 11, since in the case where the width $L_1$ is smaller than the width $L_2$, the influence of a reduction in conductance modulation is relatively small.

In the above-described embodiment, the N+ type collector-short region 15 is formed so as to be more prominent than the P+ type collector regions 12 in order for the PN junctions formed by the N− type base region 11 and the P+ type collector region 12 to be deeply biased in the forward direction. The present invention is not limited to this, but the N+ type collector-short region 15 may be formed so as to be coplanar with the P+ type collector regions 12. Further, they may be formed such that the P+ type collector regions 12 are more prominent than the N+ type collector-short region 15. In this case, it is preferred that the device be a MOSFET of a non-punch-through type in which the P+ type collector regions 12 are contacted by no depletion layer.

Figure 3:
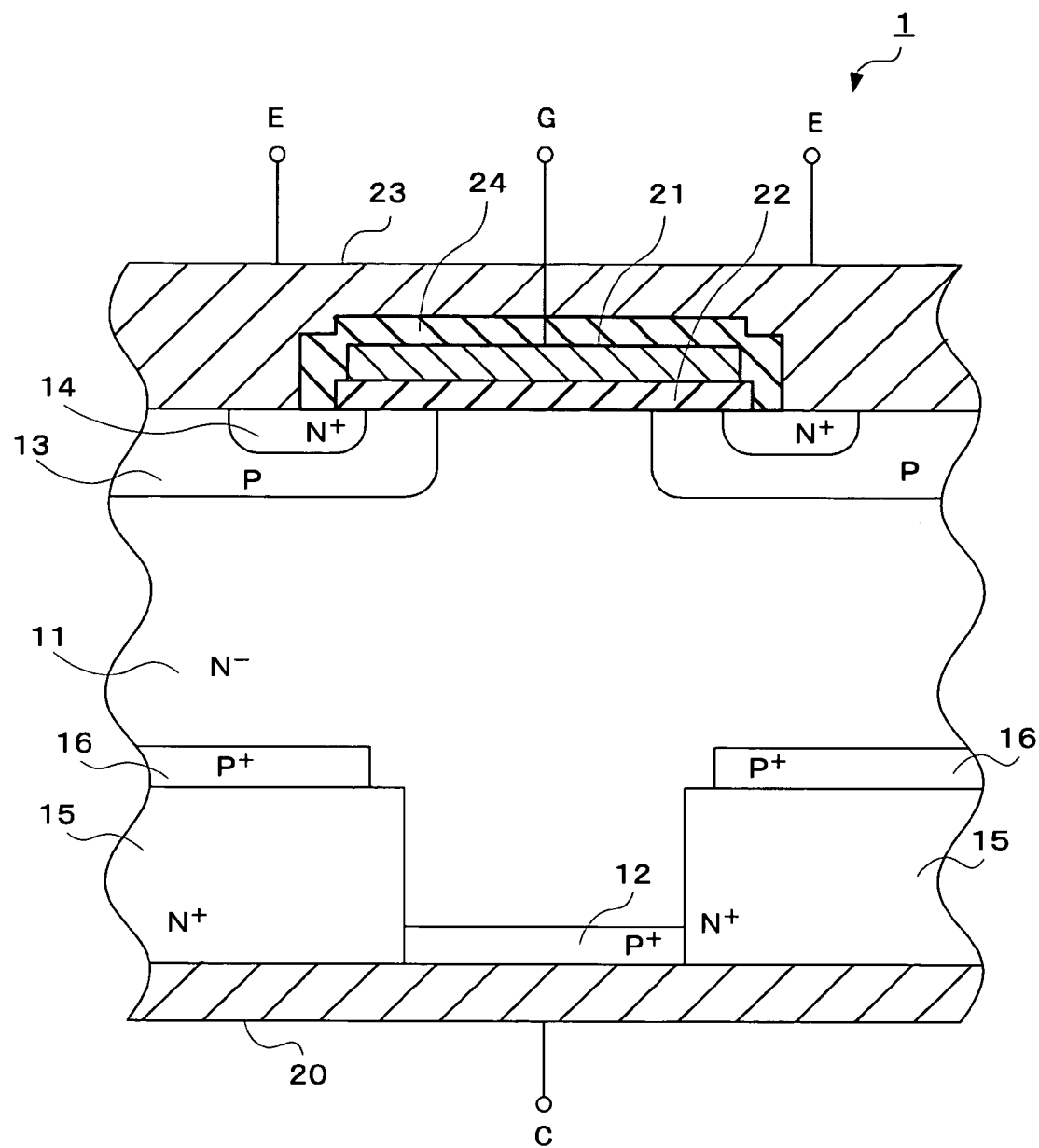
[FIG. 3] It is a diagram showing a cross-sectional structure of an insulated gate semiconductor device according to another embodiment.

Further, in the above-described embodiment, the N+ type collector-short region 15 is formed so as to face the N− type base region 11 between the P type base regions 13, and is formed so as not to face the P type base regions 13. For example, the N+ type collector-short region 15 may be formed so as to face the P type base regions 13 as shown in FIG. 3. In a case where this structure is employed, it is possible to determine the reverse-direction voltage withstand of the device by causing Avalanche breakdown between the N+ type collector short region 15 and the P type base regions 13.

Figure 4:
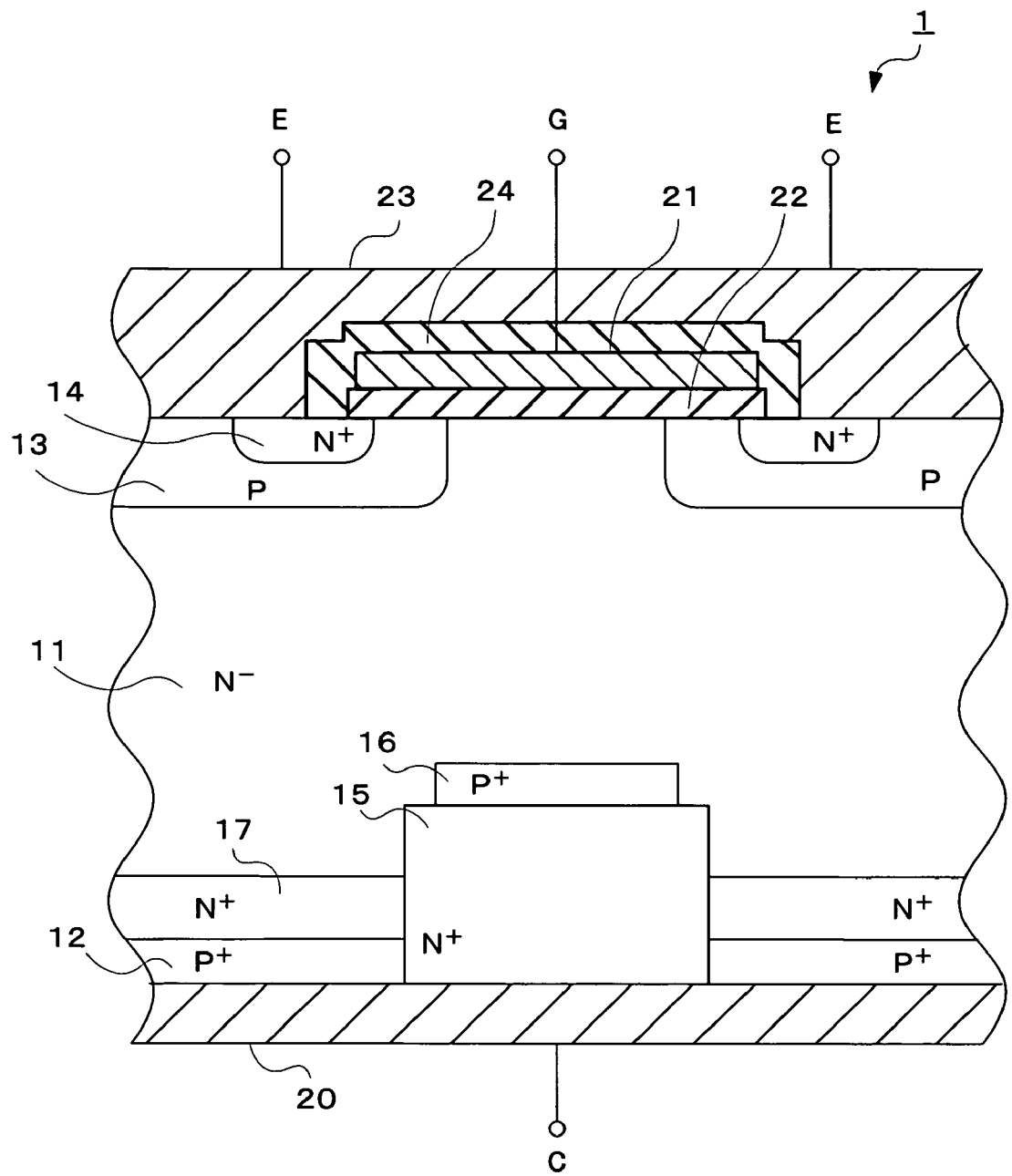
[FIG. 4] It is a diagram showing a cross-sectional structure of an insulated gate semiconductor device according to another embodiment.

Further, as shown in FIG. 4, N+ type buffer regions 17 formed of N type semiconductor regions in which an N type impurity is diffused may be formed to be adjacent to the N+ type collector-short region 15. In this case, the N+ type buffer regions 17 are formed to have an impurity concentration of about $1\times10^{15}$ to $1\times10^{17}$ cm$^{-3}$, which is higher than the N type impurity concentration of the N− type base region 11, and to have a thickness of about 5 to 30 μm.

This application is based on Japanese Patent Application No. 2004-176019 filed on Jun. 14, 2004 and including specification, claims, drawings and summary. The disclosure of the above Japanese Patent Application is incorporated herein by reference in its entirety.

INDUSTRIAL APPLICABILITY

The present invention is useful for an insulated gate semiconductor device, particularly for an insulated gate bipolar transistor.

The invention claimed is:

1. An insulated gate semiconductor device, comprising:
a first semiconductor region having a first conductivity type;
second semiconductor regions having a second conductivity type, formed in one principal surface of said first semiconductor region;
third semiconductor regions having the second conductivity type, formed in surface regions of the other principal surface of said first semiconductor region;
fourth semiconductor regions having the first conductivity type, formed in surface regions of said third semiconductor regions;
a first electrode electrically connected to said fourth semiconductor regions;
a control electrode disposed, via an insulating film, on the other principal surface between said first semiconductor region and said fourth semiconductor regions; and
a second electrode electrically connected to said second semiconductor regions,
wherein said insulated gate semiconductor device comprises;
a fifth semiconductor region having the first conductivity type, formed in the one principal surface of said first semiconductor region so as to be adjacent to said second semiconductor regions; and a sixth semiconductor region having the second conductivity type, formed between said fifth semiconductor region and said first semiconductor region, said sixth semiconductor region formed such that at least a part of said fifth semiconductor region contacts said first semiconductor region.

2. The insulated gate semiconductor device according to claim 1, wherein said sixth semiconductor region is formed between a side of said fifth semiconductor region closer to the other principal surface and said first semiconductor region.

3. The insulated gate semiconductor device according to claim 1, wherein said fifth semiconductor region is formed so as to be more prominent than said second semiconductor regions.

4. The insulated gate semiconductor device according to claim 1, wherein a width of said sixth semiconductor region is smaller than a width of said fifth semiconductor region.

5. The insulated gate semiconductor device according to clam 1, wherein concentration of an impurity of the second conductivity type in said sixth semiconductor region is $1 \times 10^{15}$ to $5 \times 10^{18}$ cm$^{-3}$.

6. The insulated gate semiconductor device according to claim 1, wherein said fifth semiconductor region is formed so as not to face said third semiconductor regions.

7. The insulated gate semiconductor device according to claim 1, wherein said first semiconductor region comprises a first region and second regions higher in impurity concentration than said first region, and said second regions are adjacent to said fifth semiconductor region.

8. The insulated gate semiconductor device according to claim 1, wherein said sixth semiconductor region is electrically floating.

9. A method for manufacturing an insulated gate semiconductor device comprising: a first semiconductor region having a first conductivity type; second semiconductor regions having a second conductivity type, formed in one principal surface of said first semiconductor region; third semiconductor regions having the second conductivity type, formed in surface regions of the other principal surface of said first semiconductor region; fourth semiconductor region having the first conductivity type, formed in surface regions of said third semiconductor regions; a first electrode electrically connected to said fourth semiconductor regions a control electrode disposed, via an insulating film, on the other principal surface between said first semiconductor region and said fourth semiconductor regions; and a second electrode electrically connected to said second semiconductor regions, said method comprising:

a step of forming a fifth semiconductor region having the first conductivity type in the one principal surface of said first semiconductor region so as to be adjacent to said second semiconductor regions; and a step of forming a sixth semiconductor region having the second conductivity type, between said fifth semiconductor region and said first semiconductor region, said sixth semiconductor region formed such that at least a part of said fifth semiconductor region contacts said first semiconductor region.

10. The method for manufacturing the insulated gate semiconductor device according to claim 9, wherein said sixth semiconductor region is formed so as to be electrically floating.

* * * * *